(12) United States Patent
Abbas (10) Patent No.: US 6,804,744 B1
(45) Date of Patent: Oct. 12, 2004

(54) CONTENT ADDRESSABLE MEMORY HAVING SECTIONS WITH INDEPENDENTLY CONFIGURABLE ENTRY WIDTHS

(75) Inventor: Fazal Abbas, Saratoga, CA (US)

(73) Assignee: Lara Technology, Inc., San Jose, CA (US)

( * ) Notice: Subject to any disclaimer, the term of this patent is extended or adjusted under 35 U.S.C. 154(b) by 0 days.

(21) Appl. No.: 09/427,971

(22) Filed: Oct. 27, 1999

(51) Int. Cl.[7] .............................................. G06F 12/02
(52) U.S. Cl. ...................... 711/108; 711/128; 711/170; 711/172; 711/173; 365/49
(58) Field of Search ................. 711/108, 128, 711/170, 173, 171, 172; 365/49

(56) References Cited

U.S. PATENT DOCUMENTS

| | | | |
|---|---|---|---|
| 4,996,666 A | | 2/1991 | Duluk, Jr. |
| 5,010,516 A | | 4/1991 | Oates |
| 5,383,146 A | * | 1/1995 | Threewitt ..................... 365/49 |
| 5,440,715 A | | 8/1995 | Wyland |
| 5,517,441 A | | 5/1996 | Dietz et al. |
| 5,893,137 A | | 4/1999 | Parks et al. |
| 5,946,704 A | | 8/1999 | Yoneda et al. |
| 5,999,435 A | * | 12/1999 | Henderson et al. ........... 365/49 |
| 6,058,452 A | * | 5/2000 | Rangasayee et al. ........ 711/108 |
| 6,081,440 A | * | 6/2000 | Washburn et al. ............ 365/49 |

* cited by examiner

Primary Examiner—Mano Padmanabhan
Assistant Examiner—Jasmine Song
(74) Attorney, Agent, or Firm—Bradley T. Sako (57) ABSTRACT

According to one embodiment, a content addressable memory (CAM) (100) includes a number of sections (106-1 to 106-i) having data value entries that can be compared to comparand values and/or comparand value portions. Each section (106-1 to 106-i) has an independently configurable width.

20 Claims, 7 Drawing Sheets

CONTENT ADDRESSABLE MEMORY HAVING SECTIONS WITH INDEPENDENTLY CONFIGURABLE ENTRY WIDTHS

TECHNICAL FIELD

The present invention relates generally to content addressable memories (CAMs) and more particularly to CAMs having configurable options.

BACKGROUND OF THE INVENTION

Information networks, including the Internet, can operate under various networking protocols. Data packets within a network can be processed according to a protocol "stack" having different layers. A data packet will typically include a header with various fields corresponding to various layers of a protocol stack.

Network hardware for processing data packets, such as a router or network switch, can include tables that store data corresponding to various network layers. When a packet arrives to a router and/or network switch, one or more fields in the packet header can be compared to corresponding tables. The packet can then be processed according to the comparison results. Content addressable memories (CAMs), also referred to as "associative memories," can provide rapid matching functions often needed in routers and network switches.

A complicating factor in packet processing can be the variable length of the various fields in a protocol stack. Such variable length fields can result in routers or network switches having a CAM dedicated to each particular field length. Consequently, when multiple fields are processed, multiple CAM devices are utilized. This can increase the size and/or cost of the resulting network hardware.

A typical CAM can store a number of data values in a CAM cell array. In a compare (i.e., match) operation, the data values can be compared to a comparand value (also referred to as a "search key"). A data value that matches the comparand value can result in a match indication. Match indications can be prioritized by a priority encoder and be utilized to generate associated data. One example of associated data can be "next hop" information in the case of a connectionless network structure.

CAMs can be synchronous and/or asynchronous. A synchronous CAM can perform matching functions on applied comparand values according to a periodic timing signal (such as a system clock, as one example). An asynchronous CAM can perform matching functions on applied comparand value according a non-periodic timing signal (such as an applied comparand value, as just one example).

It is often desirable for synchronous CAMs to operate according to particular timing specifications. As just one example, it is desirable to have a CAM that can receive a comparand value on a certain clock edge, and then provide a compare result a predetermined number of clock cycles later. Such configurations can allow data values to be "pipelined," which can generate compare results every clock cycle.

CAMs can include "binary" CAMs in which a multi-bit comparand value must match with every bit of a data value to generate a match indication. CAMs can also include "ternary" CAMs in which multi-bit comparand values can be compared with "maskable" data values. A maskable data value can have one or more bits that can be masked from the compare operation. A masked data value bit will not generate a mismatch indication even if the masked data value bit is different than the corresponding comparand value bit.

A conventional CAM will now be described to better understand the various disclosed embodiments of the present invention.

Figure 9:
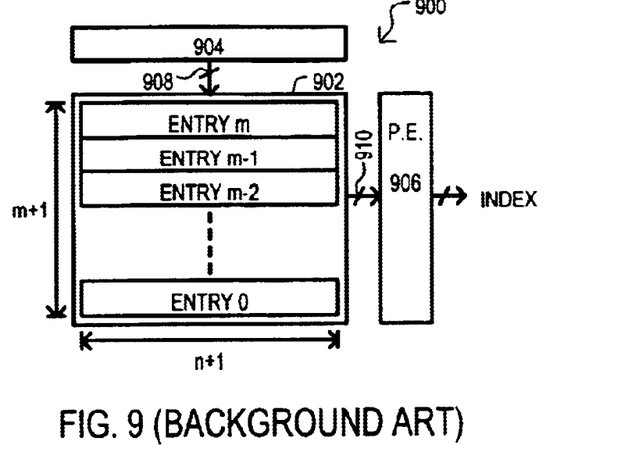
FIG. 9 is a block schematic diagram of a conventional content addressable memory.

Referring now to FIG. 9, a block diagram is set forth illustrating a conventional CAM. The conventional CAM is designated by the general reference character 900, and is shown to include CAM cell array 902, a comparand register 904 and a priority encoder 906. A CAM cell array 902 can include a number of entries, shown as "ENTRY m" through "ENTRY 0." Each entry can store a data value that is compared to an applied comparand value. Further, each entry has the same number of bits. In the arrangement of FIG. 9, each entry can include "n+1" bits. In many CAMs an entry corresponds to a row of CAM cells.

One way to conceptualize a CAM cell array 902 is to describe it as having a particular width and depth. A width can be the size of the data values stored and a depth can be the total number of data values that can be stored. Accordingly, in the example of FIG. 9, the CAM cell array 902 has a depth of m+1 and a width of n+1.

A comparand register 904 can store a comparand value that is to be compared with data values in the CAM cell array 902. In the arrangement of FIG. 9, a comparand will typically have the same width as the CAM cell array 902.

A CAM cell array 902 can receive a comparand value by way of compare lines 908. Resulting match results (which may be a "match" or "no match," for example) can be provided by way of match lines 910. Typically, one match line can be associated with each entry of the CAM cell array 902.

The priority encoder 906 can encode match indications into corresponding index values INDEX. Further, if more than one of the match lines 910 indicates a match, a priority encoder 906 can generate one INDEX value according to predetermined criteria (such as entry position, as but one example).

Figure 10:
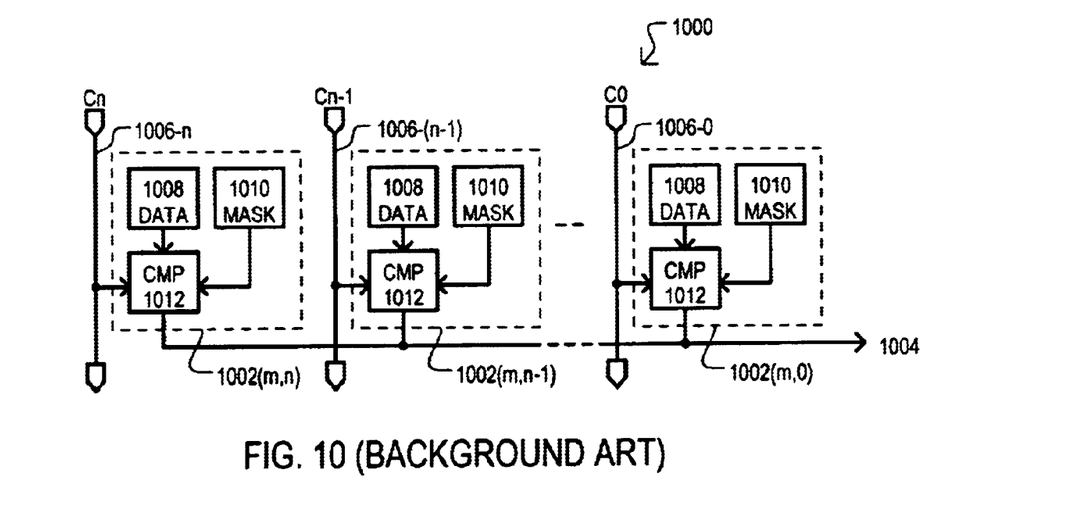
FIG. 10 is a schematic diagram of a row in a conventional ternary content addressable memory.

Referring now to FIG. 10, a typical ternary CAM array row is illustrated in a schematic diagram. The CAM array row is designated by the general reference character 1000, and is shown to include "n+1" ternary CAM cells 1002(m,n) to 1002(m,0). The ternary CAM cells (1002(m,n) to 1002(m,0)) of the row are commonly connected to a match line 1004. Each ternary CAM cell (1002(m,n) to 1002(m,0)) is further connected to a corresponding comparand line (1006-n to 1006-0).

Each ternary CAM cell (1002(m,n) to 1002(m,0)) includes a data store 1008, a mask store 1010, and a maskable compare circuit 1012. A data store 1008 can store a data value portion (such as a bit). A mask store 1010 can store a mask value portion (such as a bit). A maskable compare circuit 1012 can compare a data value portion to a comparand portion on a compare line. The results of the compare operation can be masked (or not masked) according to a mask value portion.

In one particular arrangement, a match line 1004 can be precharged (or predischarged) to a particular potential, and then be discharged (or charged) when one or more CAM cells (1002(m,n) to 1002(m,0)) indicates a mismatch (i.e., no match between a comparand portion and stored data value portion).

A ternary CAM can advantageously provide specialized match functions, such as a longest prefix match. A longest prefix match can provide a match indication for a data value having the largest number of leading consecutive bits that match a comparand value. Longest prefix matching can be a valuable function in many types of network hardware.

To provide a match function for multiple layer fields, multiple CAMs, such as that set forth in FIG. 9 can be used, with one or more CAMs being dedicated to a particular field length.

It would be desirable arrive at some way of providing match functions for multiple fields that includes fewer system components.

SUMMARY OF THE INVENTION

According to the disclosed embodiments, a content addressable memory (CAM) can include a number of CAM cells formed in an array and arranged into two or more sections. Each section can have an independently configurable width.

According to one aspect of the embodiments, a CAM can include a number of entries that each provide an entry match indication that can provide match results between comparand and data values of a first size. Multiple entry match indications can be combined to provide match indications between comparand and data values of a second size that is larger than the first size.

According to another aspect of the embodiments, a CAM can include two or more sections having independently configurable widths and a configuration register. The sections can be configured according to configuration information stored in the configuration register.

According to another aspect of the embodiments, a CAM can include two or more sections, each having at least two sub-sections. Each section can be configured into a first, second, or third mode. In a first mode, a comparand can be compared to the two sub-sections of a section. In a second mode, a first comparand value portion can be compared to one sub-section and a second comparand value portion can be compared to another section. In a third mode, a first comparand value portion can be compared to selected entries in a first sub-section, a second comparand value portion can be compared to selected entries in a second sub-section, a third comparand value portion can be compared to selected entries in the first sub-section, and a fourth comparand value portion can be compared to selected entries in the second sub-section.

According to another aspect of the embodiments, a CAM can include a first mode that compares a comparand value to data values in a single compare operation to generate match results. The CAM can further include a second mode that compares a comparand value to data values with multiple compare operations. Match indications from the multiple compare operations can be logically combined to generate match results.

According to another aspect of the embodiments, a CAM can include two or more sections of ternary CAM cells that have independently configurable widths.

DETAILED DESCRIPTION OF THE EMBODIMENTS

Figure 1:
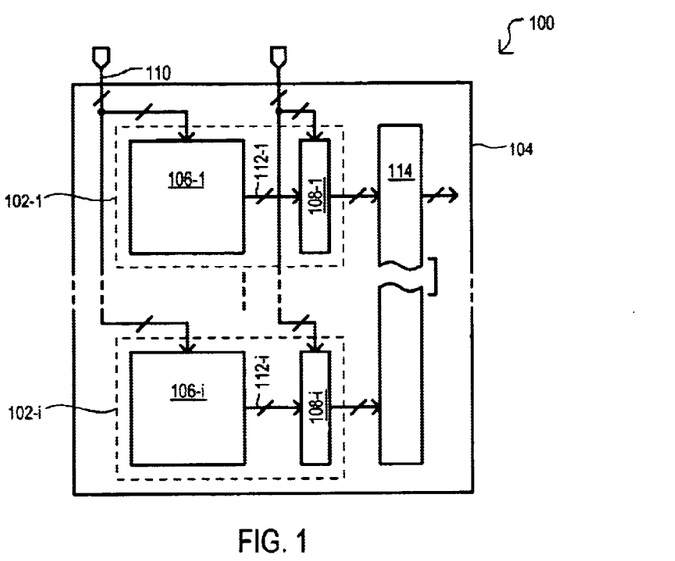
FIG. 1 is a block diagram of a first embodiment.

Various embodiments will now be discussed in conjunction with a number of drawings. Referring now to FIG. 1, a first embodiment is set forth in a block diagram and designated by the general reference character 100. The first embodiment 100 may include a number of sections 102-1 to 102-i formed in a substrate 104. A substrate 104 can include a semiconductor material, such as monocrystalline silicon, as just one example.

In the particular arrangement of FIG. 1, each section (102-1 to 102-i) may include an array of CAM cells (106-1 to 106-i) and a logic circuit (108-1 to 108-i). Each array of CAM cells (106-1 to 106-i) can include a number of entries that can store data values for compare operations.

In a compare operation, a comparand value (or a portion thereof) can be applied to the CAM cell arrays (106-1 to 106-i) by way of a comparand bus 110. In response to the comparand value (or portion thereof), each CAM cell array (106-1 to 106-i) can generate a number of match indications on match lines (112-1 to 112-i). Match indications can indicate a match or mismatch between a comparand value (or portion thereof) and the various entries within the CAM cell arrays (106-1 to 106-i)

Unlike conventional CAM approaches, the various match lines (112-1 to 112-i) can be applied to a corresponding logic circuit (108-1 to 108-i). The operation of each logic circuit (108-1 to 108-i) can be set according to a particular configuration. In one configuration, a comparand value may be applied in whole, and the logic circuits (108-1 to 108-i) can be essentially "transparent," passing match indications on to a priority encoder 114. In another configuration, however, two or more portions of a comparand value can be applied, and the logic circuits (108-1 to 108-i) may combine match indications corresponding to the various comparand portions in a predetermined fashion to generate combination match indications. Such combination match indications can be passed on to the priority encoder 114.

Figure 2A:
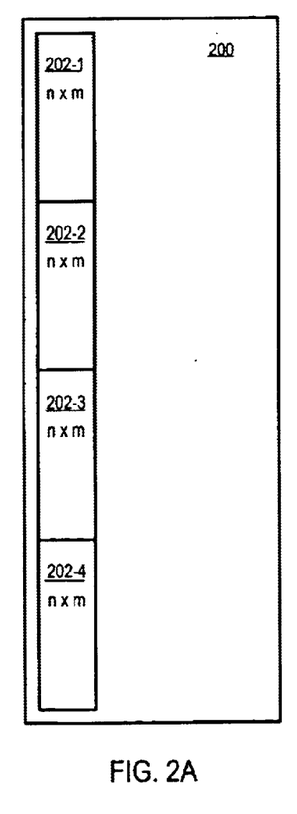
FIGS. 2A to 2C are block diagrams illustrating various examples of different configurations of an embodiment.
Figure 2B:
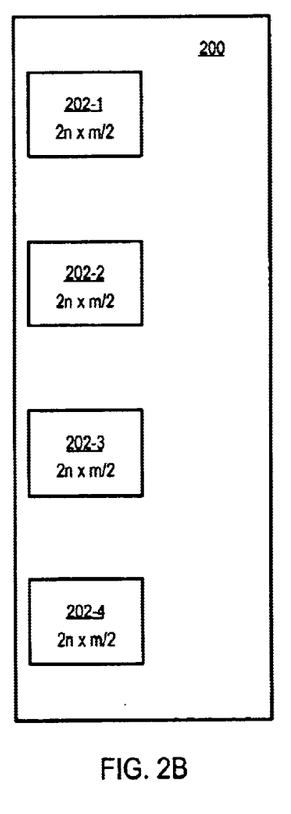
Figure 2C:
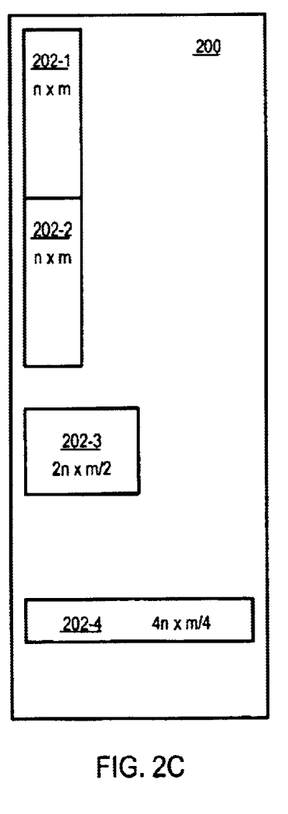

Referring now to FIGS. 2A–2C, three examples are set forth illustrating possible configurations for the same CAM according to one embodiment of the present invention. The CAM is designated by the general reference character 200 and includes four independently configurable sections 202-1 to 202-4. The various sections may be conceptualized as tables of various sizes. In FIG. 2A, all illustrated sections (202-1 to 202-4) of the CAM 200 are configured the same, resulting in four tables of width "n" and depth "m." Thus, a comparand value of width "n" may be applied to all sections (202-1 to 202-4) essentially simultaneously to generate match indications.

In the example of FIG. 2B, all illustrated sections (202-1 to 202-4) of the CAM 200 are configured the same.

However, unlike the configuration of FIG. 2A, the effective width each section (202-1 to 202-4) is doubled. In the particular arrangement of FIGS. 2A–2C, an increase in width results in a corresponding decrease in depth. Consequently, the configuration of FIG. 2B provides four tables of width 2n and depth ½m. In one particular arrangement, a comparand value of width 2n may be applied in portions to all sections (202-1 to 202-4). A first comparand portion of width n can be applied to one region of the sections (202-1 to 202-4) and a second subsequent comparand portion of width n can then be applied to other regions of the sections (202-1 to 202-4).

In the example of FIG. 2C, two sections (202-1 and 202-2) of the CAM have a first configuration, while two other sections (202-3 and 202-4) have different configurations. Sections 202-1 and 202-2 provide two tables, each having a width of n and a depth of m. A comparand value of size n may be applied to these tables as described in conjunction with FIG. 2A. Section 202-3 provides a table of width 2n and depth ½m. A comparand value of size 2n may be applied to this table as described in conjunction with FIG. 2B. Section 202-4 is configured to provide a table of width 4n and depth ¼m. A comparand value of width 4n may be applied to this table in four portions of size n.

Of course, numerous other possible configurations are possible, and the three examples are intended to be illustrative only.

A CAM having sections that can provide multiple tables of various sizes can eliminate the need for multiple CAM devices, as different size lookup operations can be performed by a single device. Referring back to FIG. 2C, a particular example will be given. Arriving network packets may include one header field of a size that is less than or equal to n, and another field that is greater than 2n. A single CAM such as that set forth in FIG. 2C may provide the corresponding lookup tables necessary. In particular, the field having a size ≦n can be searched in sections 202-1 and 202-2 while the field of size <2n could be searched in section 202-4.

Figure 3:
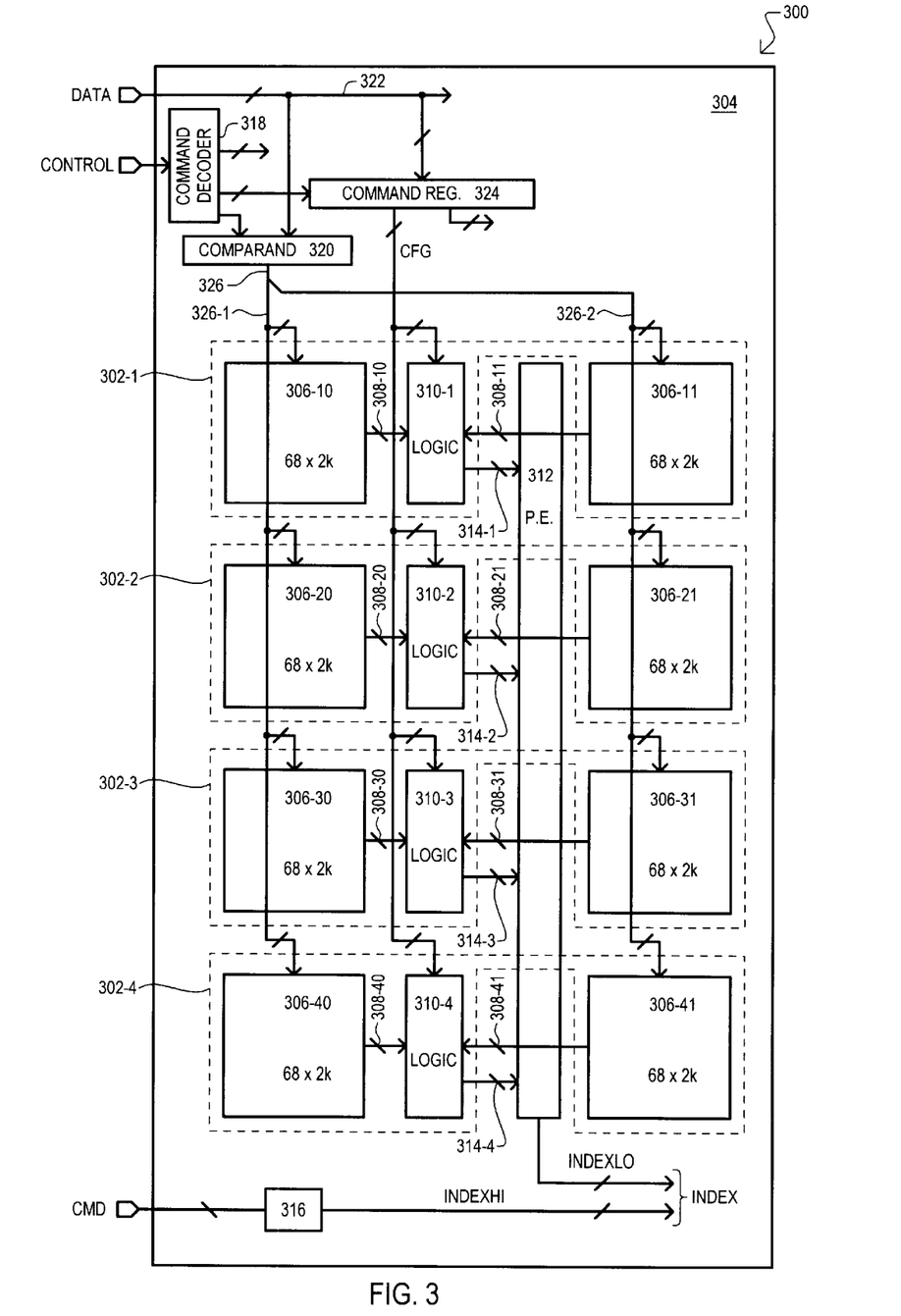
FIG. 3 is a schematic diagram of a second embodiment.

Referring now to FIG. 3, a second embodiment is set forth in schematic diagram. The second embodiment is designated by the general reference character 300 and is shown to include a number of sections 302-1 to 302-4 formed in a substrate 304. In one very particular arrangement, each section (302-1 to 302-4) may include CAM cells arranged into a 68×4 k array.

Each section (302-1 to 302-4) can include a number of CAM cells further arranged into sub-sections (306-10/11 to 306-40/41). Each sub-section (306-10/11 to 306-40/41) can include data value entries that can be compared to a comparand value (or a portion thereof). Compare results from each sub-section (306-10/11 to 306-40/41) can be provided on corresponding match lines (308-10/11 to 308-40/41). In one very particular arrangement, each sub-section (306-10/11 to 306-40/41) can include CAM cells arranged in a 68×2 k array.

In the particular arrangement of FIG. 3, match lines of the same section are commonly connected to a logic circuit (310-1 to 310-4) within the section. For example, match lines 308-10 and 308-11 are connected to logic circuit 310-1, match lines 308-20 and 308-21 are connected to logic circuit 310-2, match lines 308-30 and 308-31 are connected to logic circuit 310-3, and match lines 308-40 and 308-41 are connected to logic circuit 310-4.

Logic circuits (310-1 to 310-4) may be configurable according to configuration data CFG. The logic circuits (310-1 to 310-4) can include a first mode that results in essentially transparent operation and at least one other mode that results in the logic circuit combining the values of two or more match lines to generate combination match results.

In one very particular arrangement, the CFG data may include eight bits, with two bits being associated with each section (302-1 to 302-4). Two configuration bits may establish one of three modes. As but one example, a two configuration bit value of "00" may result in the corresponding logic circuit being placed in an essentially transparent mode. A two configuration bit value of "01" may result in the corresponding logic circuit combining the values of a match line from one subsection and a match line from another subsection. A two configuration bit value of "10" may result in the corresponding logic circuit combining the values of two match lines from one subsection and two match lines from another subsection.

Referring back to FIGS. 2A–2C, in the above example, the configuration of FIG. 2A may be established by a CFG value of "00 00 00 00." The configuration of FIG. 2B may be established by a CFG value of "01 01 01 01." The configuration of FIG. 2C may be established by a CFG value of "00 00 01 10."

The match results or combination match results from each logic circuit (310-1 to 310-4) can be supplied to a priority encoder 312 by way of logic output lines 314-1 to 314-4. A priority encoder 312 may generate index results according to active match results provided on logic output lines (314-1 to 314-4).

It is understood that match results on logic output lines (314-1 to 314-4) can vary according to the particular mode that the logic circuit (310-1 to 310-4) is in. For example, in one mode, an active logic output line may indicate a match between a comparand value and a single entry in a sub-section. In another mode, an active logic output may indicate a match between multiple comparand portions and multiple entries in two sub-sections.

In one very particular example, an active logic output may indicate a match between a 68-bit comparand value and a 68-bit bit entry in a first mode. In a second mode, an active logic output may indicate a match between a 136-bit comparand value and a 136-bit data value stored in two 68-bit entries. In a third mode, an active logic output may indicate a match between a 272-bit comparand value and a 272-bit data value stored in four 68-bit entries.

In response to various match result values, the priority encoder 312 can provide an output index value, shown as INDEXLO. An INDEXLO value may be combined with an INDEXHI value stored in an index store 316 to generate an output INDEX value. In one very particular arrangement INDEX values can serve as addresses to a random access memory, such as a static random access memory, as just one example.

A priority encoder 312 may provide index values that vary according to configuration. As just one very particular example, in the event the second embodiment included sections (302-1 to 302-4) configured as a x68 table, a x136 table, and a x272 table, index values generated by a x68 match could have a predetermined number of bits. An index value generated by a x136 match could have the same number of bits, but the least significant bit could be set to a predetermined value (such as "0"). An index value generated by a x272 match could have the same number of bits, but the least two significant bit could be set to a predetermined value (such as "00").

The second embodiment 300 is shown to further include control and storage circuits. In particular, a command decoder 318 can receive various control inputs CONTROL and generate control signals therefrom. Such control signals can enable a comparand register 320 to store a comparand value driven on a data bus 322. Further, one or more other control signals can enable a command register 324 to store data driven on data bus 322, including configuration data CFG, previously described. Of course the command and store arrangement illustrated in FIG. 3 is but one of many possible arrangements, and should not be construed as being limited thereto.

In the arrangement of FIG. 3, comparand data can be applied to the various sections (302-1 to 302-4) by way of a comparand bus 326. A comparand bus 326 can further be split into two comparand bus portions 326-1 and 326-2, that commonly supply comparand data to selected sub-sections. In particular, comparand bus portion 326-1 can supply comparand values to sub-sections 306-10/20/30/40, while comparand bus portion 326-2 can supply comparand values to sub-sections 306-11/21/31/41.

Figure 4:
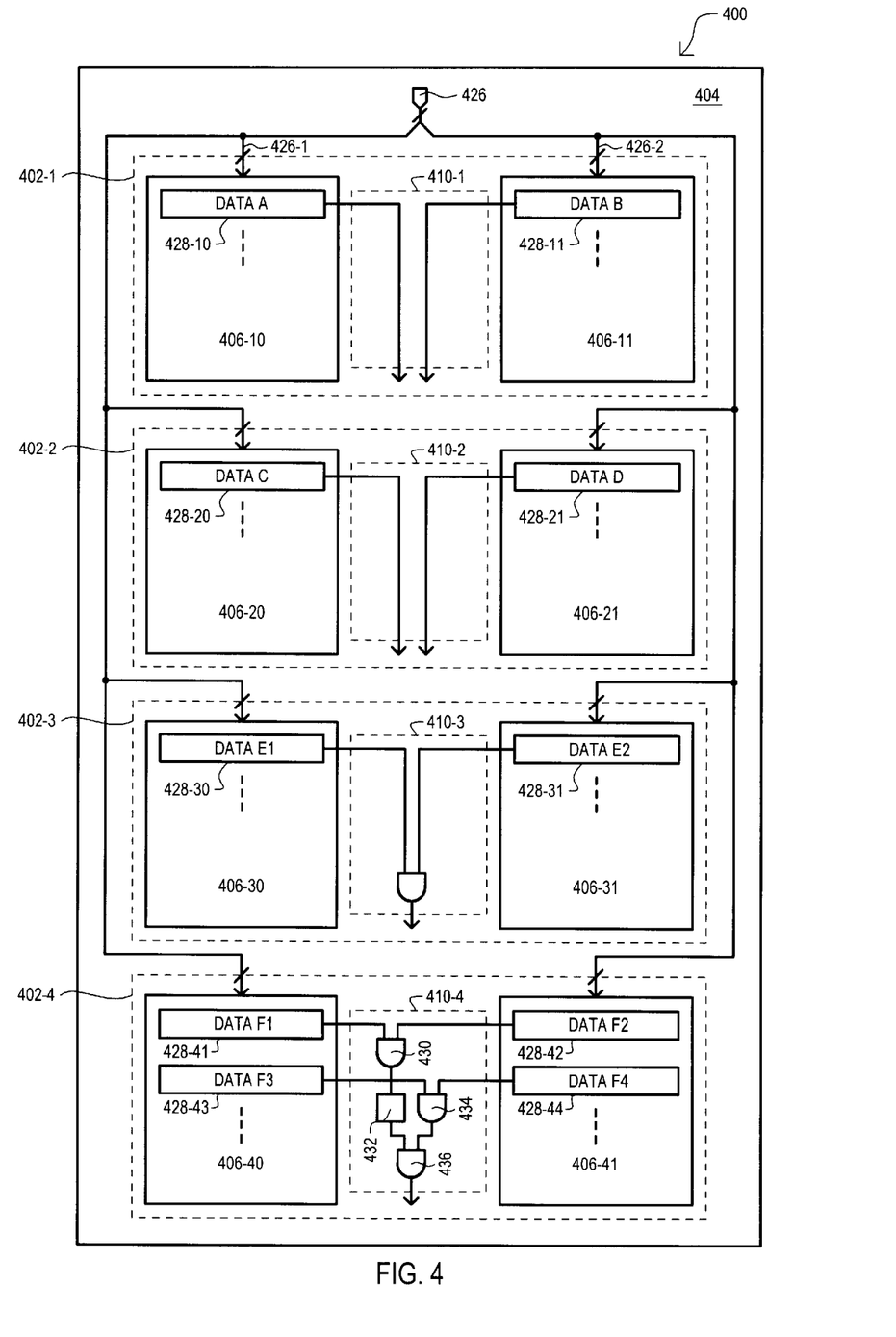
FIG. 4 is a schematic diagram describing various matching operations according to a third embodiment.

Referring now to FIG. 4, a schematic diagram of a CAM is set forth, showing examples of various matching operations according to a third embodiment. The third embodiment is designated by the general reference character 400 and includes some of the same constituents set forth in FIG. 3. To that extent, like features will be referred to with the same reference character. Thus, the third embodiment 400 includes sections 402-1 to 402-4 formed in a substrate 404, sub-sections 406-10 to 406-41, logic circuits 410-1 to 410-4, and a comparand bus 426 having comparand bus portions 426-1 and 426-2.

Also set forth in FIG. 4 are a number of entries within each section (402-1 to 402-4). In particular, an entry 428-10 to 428-31 is shown in sub-sections 406-10 to 406-31, respectively. In addition, two entries 428-41/43 and 428-42/44 are shown in sub-sections 406-40 and 406-41, respectively.

In FIG. 4, the sections (402-1 to 402-4) are configured in the same general fashion as the CAM of FIG. 2C. That is, sections 402-1 and 402-2 are configured to provide a "by n" comparison, section 402-3 is configured to provide a "by 2n" comparison, and section 402-4 is configured to provide a "by 4n" comparison.

The various logic circuits 410-1 to 410-4 are shown in a resulting function brought about by configuration information. Logic circuits 410-1 and 410-2 are essentially transparent, providing match results from the match lines of each sub-section (406-10 to 406-21). FIG. 4 also shows how data values may be stored within the entries of sub-sections (406-10 to 406-21). "Whole" data values DATAA to DATAD are stored within the sub-sections, and may each be compared with a comparand of width "n".

Logic circuit 410-3 logically combines the match result from the entry of one sub-section 428-30 with the match result of another sub-section 428-31. In the particular arrangement of FIG. 4, a logic circuit 410-3 can essentially logically AND the two match results. The entries within section 402-3 each store a portion of a data value. In the particular example of FIG. 4, entries 428-30 and 428-31 each store a portion of a data value, shown as DATAE1 and DATAE2. Thus, a first comparand portion of size n can be compared with entries within sub-section 406-30, and a second comparand portion of size n can be compared with entries within sub-section 406-31. In this way a compare operation can be performed on comparand value of width 2n.

Logic circuit 410-4 logically combines the match result from two entries of one sub-section (428-41 and 428-43) with the match results of two entries from another sub-section (428-42 and 428-44). In the particular arrangement of FIG. 4, a logic circuit 410-4 can essentially logically AND the four match results. Entries 428-41 and 428-42 can be logically combined in a first operation by an AND gate 430. This result can be stored in a register 432. Entries 428-43 and 428-44 can be logically combined in a second operation by an AND gate 434. This logic value can then be logically combined with the value in register 432 by AND gate 436.

The entries within section 402-4 can each store a portion of a data value. In the particular example of FIG. 4, entries 428-41 to 428-44 each store a portion of a data value, shown as DATAF1 to DATAF4. Thus, a first comparand portion of size n can be compared with some entries within sub-section 406-40, a second comparand portion of size n can be compared with some entries within sub-section 406-41, a third comparand portion of size n can be compared with other entries within sub-section 406-40, and a fourth comparand portion of size n can be compared with other entries within sub-section 406-41. In one very particular example, first and third comparand portions may be compared with even and odd entries, respectively, within sub-section 406-40. Second and fourth comparand portions may be compared with even and odd entries, respectively, within sub-section 406-41.

Of course, it is understood that the logic circuits (410-1 to 410-4) of FIG. 4 represent how each particular logic circuit operates in given configuration. Any of the logic circuits (410-1 to 410-4) can function in any of the various configurations illustrated according to applied configuration information.

Figure 5:
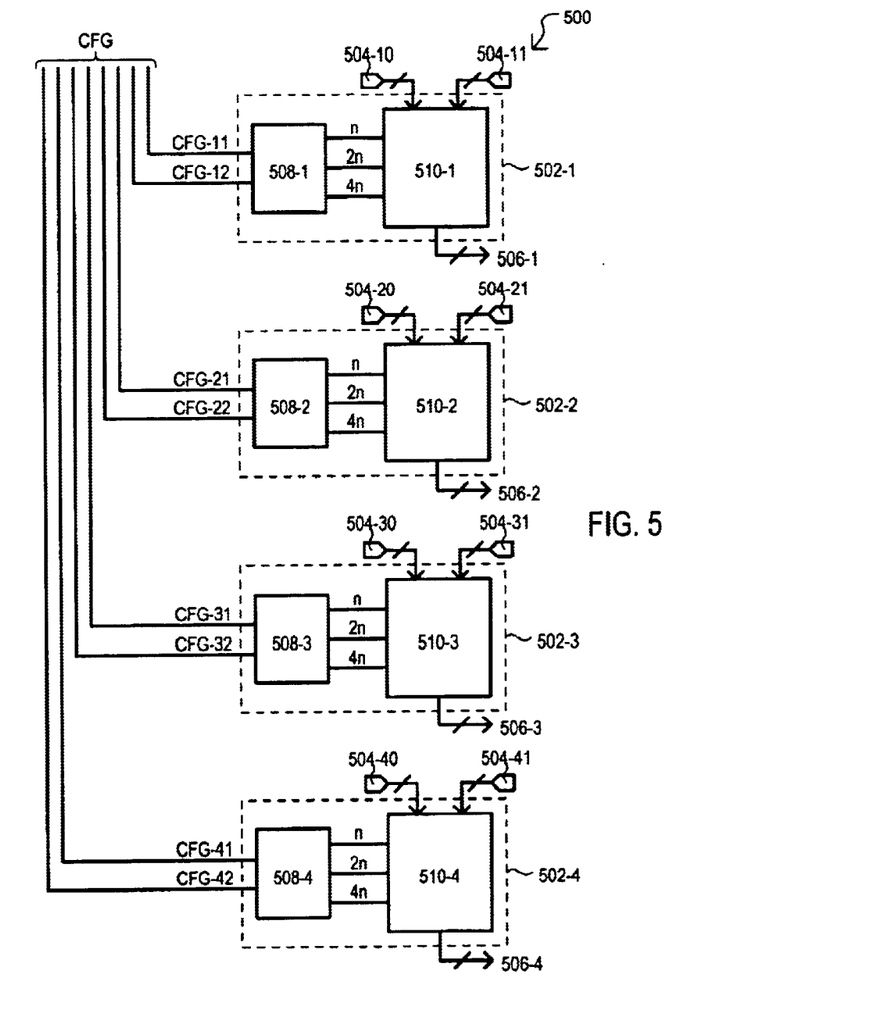
FIG. 5 is a block diagram of one example of a logic circuit arrangement that may be used in various embodiments.

FIG. 5 illustrates one example of a logic circuit arrangement may be used in the embodiments. The arrangement is designated by the general reference character 500, and is shown to include logic circuits, 502-1 to 502-4, that may each be associated with a section within a CAM. In the particular arrangement of FIG. 5, each logic circuit (502-1 to 502-4) can receive two configuration bits, shown as CFG-11/12, CFG-21/22, CFG-31/32 and CFG-41/42. In response to the configuration information, a logic circuit may or may not combine match indication values. Match indication values are shown as 504-10 to 504-41. Logic circuit outputs are shown as 506-1 to 506-4.

Each logic circuit (502-1 to 502-4) may include a decoder (508-1 to 508-4) and a combining circuit (510-1 to 510-4). A decoder (508-1 to 508-4) may receive configuration information, and in response thereto, activate a particular configuration line. In the particular arrangement of FIG. 5, the decoders (508-1 to 508-4) provide three configuration lines: A "x n" line that can enable comparisons between comparands and entries of width n, a "x 2n" line that can enable comparisons between comparands and entries of width 2n, and a "x 4n" line that can enable comparisons between comparands and entries of width 4n.

A combining circuit (510-1 to 510-4) can logically combine selected numbers of match indication values according to the activation of a configuration line. As but one example, the activation of a "x n" line can result in no combination, the activation of a "x 2n" line can result in the combination of two match indications, and the activation of a "x 4n" line can result in the combination of four match indications.

Figure 6:
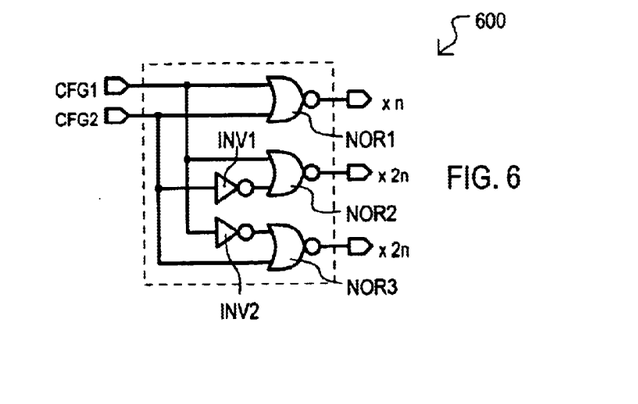
FIG. 6 is a schematic diagram of a decoder that may be used in various embodiments.

Referring now to FIG. 6, one example of a decoder is set forth in a schematic diagram and designated by reference character 600. In the decoder example of FIG. 1, a decoder 600 may include logic gates NOR1 to NOR3 and associated inverters INV1 and INV2. In response to CFG-1=0 and CFG-2-=0, the "x n" line will be activated (driven high in this particular example). In response to CFG-1=1 and CFG-2=0, the "x 2n" line will be activated. In response to CFG-1=0 and CFG-2=1, the "x 4n" line will be activated.

Figure 7:
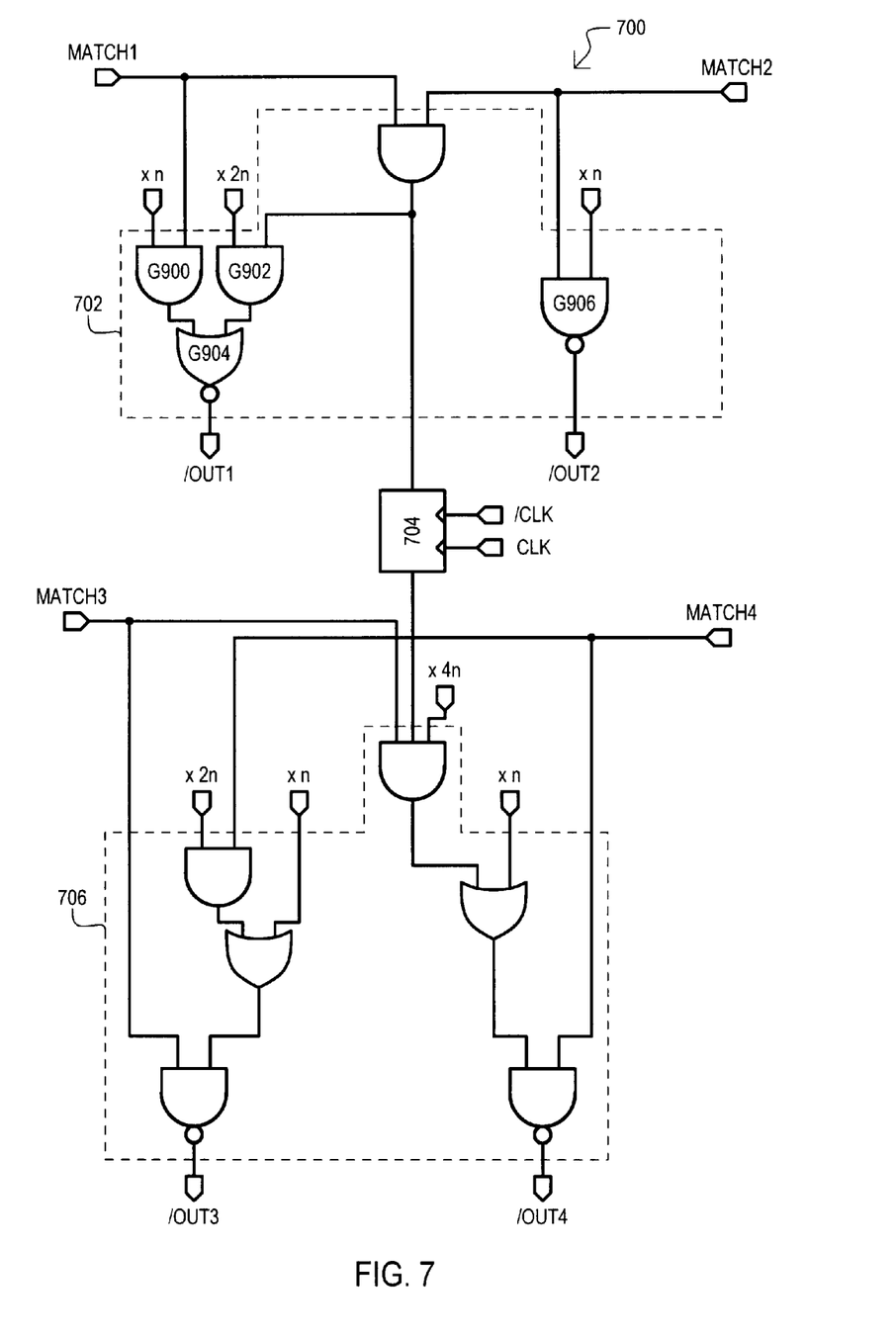
FIG. 7 is schematic diagram of a combining circuit that may be used in various embodiments.

Referring now to FIG. 7, one example of a combining circuit is set forth in a schematic diagram. The combining circuit is designated by the general reference character 700, and is shown to receive four match indications: MATCH1, MATCH2, MATCH3 and MATCH4.

A first combining section 702 can receive match indications MATCH1 and MATCH2, as well as the "x n" and "x 2n" signal lines. When the "x n" signal is active (high in this particular example), first combining section 702 will provide output signals /OUT1 and /OUT2 that follow the MATCH1 and MATCH2 indications. In the particular arrangement of FIG. 7, the output signal /OUT1 will be the inverse of MATCH1 and the output signal /OUT2 will be the inverse of MATCH2. When the "x 2n" signal is active, the /OUT1 signal will be the logical NAND of the MATCH1 and MATCH2 indications. The /OUT2 value will be forced high. The first combining section 702 also provides the logical AND of the MATCH1 and MATCH2 indications to a register 704.

A register 704 may store the logical combination of the MATCH1 and MATCH2 indications according to complementary clock signals CLK and /CLK. This value may be used in a "x 4n" compare operation.

A first combining section 706 can receive match indications MATCH3 and MATCH4, as well as the "x n", "x 2n", and "x 4n" signal lines. When the "xn" signal is active (high), second combining section 706 will provide output signals /OUT3 and /OUT4 that follow the MATCH3 and MATCH4 indications. When the "x 2n" signal is active, the /OUT3 signal will be the logical NAND of the MATCH3 and MATCH4 indications. The /OUT4 value will be forced high. When the "x 4n" signal is active, the /OUT4 signal will be the logical NAND of the MATCH 1, MATCH2, MATCH3 and MATCH4 indications. In the particular arrangement of FIG. 7 this can be accomplished by using the value stored in register 704.

Various approaches to logically combining match indications are further described in commonly owned, co-pending U.S. patent application Ser. No. 09/376,397, entitled CONTENT ADDRESSABLE MEMORY WITH REDUCED TRANSIENT CURRENT, the contents of which are incorporated by reference herein.

FIGS. 8A to 8D illustrate a table configuration identification approach according to one embodiment. A table configuration identification approach can prevent false match indications when a CAM according to the various embodiments has tables of different configurations.

Figure 8A:
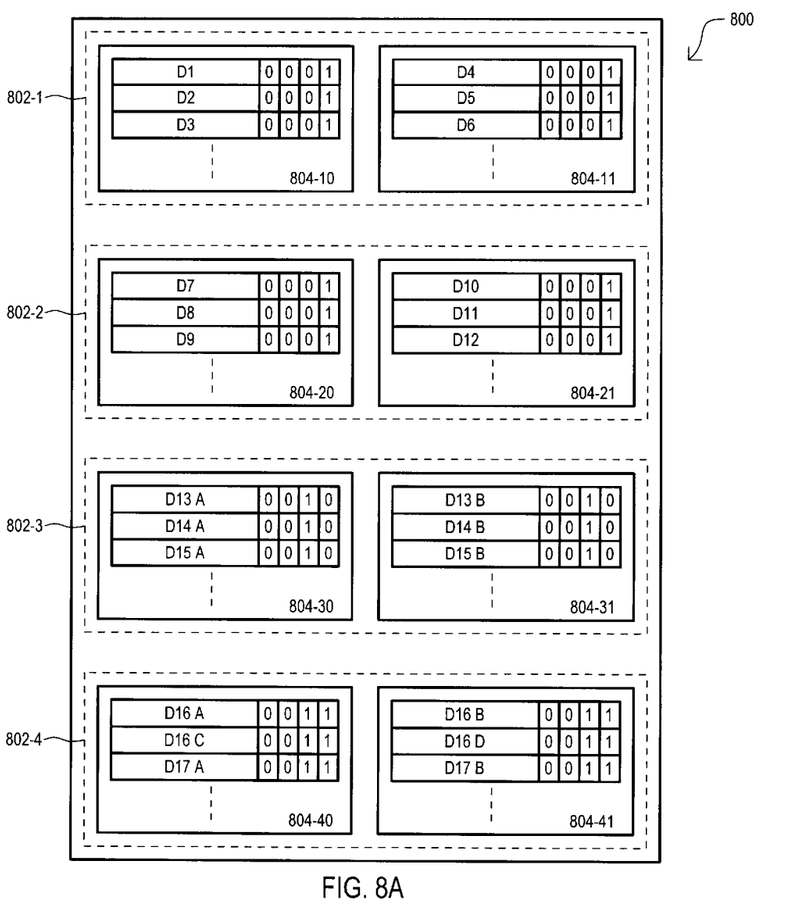
FIGS. 8A–8D illustrate a table configuration identification approach according to one embodiment.

Referring now to FIG. 8A, a CAM 800 is illustrated that includes a number of sections 802-1 to 802-4, each including two sub-sections 804-10/11, 804-20/21, 804-30/31 and 804-40/41. In the view of FIG. 8A, three entries in each sub-section (804-10 to 804-41) are shown. Each entry can store a data value, but in addition, can also store one or more extra bits. In the example of FIG. 8A, each entry includes four extra bits.

The extra bits of an entry may be used to indicate the configuration of table. This can prevent a comparand of the wrong size from generating an erroneous match indication. In the example of FIG. 8A, a table of width "n" is indicated by last two extra bits having the value "01", a table of width "2n" is indicated by last two extra bits having the value "10", and a table of width "4n" is indicated by last two extra bits having the value "11." Of course, the table identifying bits could have different values and be situated in different locations provided applied comparand values have table identifying bits in like locations. The remaining two extra bits of the example of FIG. 8A may be utilized for other purposes.

As is shown in FIG. 8A, the CAM has the same general configuration as the CAM in FIG. 2C. Sections 802-1 and 802-2 have a "x n" configuration, section 802-3 has a "x 2n" configuration, and section 802-4 has a "x 4n" configuration.

Figure 8B:
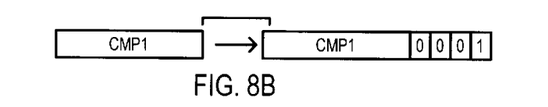
Figure 8C:
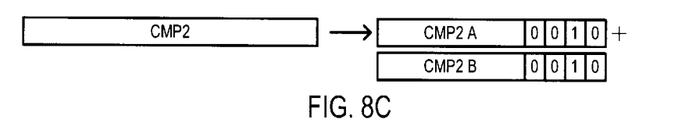
Figure 8D:
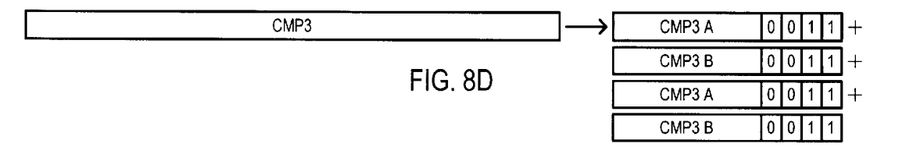

FIGS. 8B–8D illustrate three different comparand values that may be used in conjunction with the configuration of FIG. 8A. Also illustrated in FIGS. 8B–8D is a way in which the various comparand values may be applied to the CAM of FIG. 8A.

FIG. 8B shows a first comparand value CMP1 having a width of n–4 or less. When such a comparand is applied, table identifying bits can be added. This is shown by the representation on the right. If the example of FIG. 8A is considered, such table identifying bits will prevent a match from being generated in sections 802-3 and 802-4, thereby preventing an erroneous match from the larger width tables.

FIG. 8C shows a second comparand value CMP2 having a width of 2n–8 or less. When such a comparand is applied, it can be divided into two portions, with table identifying bits being added to each portion. This is shown by the representation on the right. If the example of FIG. 8A is considered, such table identifying bits will prevent a match from being generated in sections 802-1, 802-2 and 802-4.

FIG. 8D shows a third comparand value CMP3 having a width of 4n–16 or less. When such a comparand is applied, it can be divided into four portions, with table identifying bits being added to each portion. This is shown by the representation on the right. If the example of FIG. 8A is considered, such table identifying bits will prevent a match from being generated in sections 802-1, 802-2 and 802-3.

It is noted that various embodiments could have a variety of timing schemes, including "self-timed" arrangements generated off of an initial timing signal and/or particular device condition. However, a CAM according to the various embodiments is preferably a synchronous device that performs operations essentially synchronously with one or more external clock signals.

It is understood that teachings set forth herein can be utilized in various CAM arrangements, including both binary and ternary CAMs.

Further, while the various embodiment have illustrated CAMs that utilize a priority encoder that generates an index, other embodiments could include a CAM having associated data stored in CAM cells and/or random access memory cells incorporated into the CAM device.

It is also understood that while some of the embodiments have set forth arrangements that provide one or more registers that can store configuration information, a CAM according the present invention may include other structure that store such information. Configuration information could be programmed into nonvolatile storage elements, or established by opening fusible links and/or metallization options, to name but a few of the many possible examples.

Thus, while the preferred embodiments set forth herein have been described in detail, it should be understood that the present invention could be subject various changes, substitutions, and alterations without departing from the spirit and scope of the invention. Accordingly, the present invention is intended to be limited only as defined by the appended claims.

What is claimed is:

1. A content addressable memory (CAM), comprising:
an integrated circuit substrate; and
a plurality of CAM cell arrays formed in the substrate, each CAM cell array including a plurality of entries that each include at least one match line and store data values and being separately configurable between at least two modes, each mode comparing a different size comparand value to the data values of the CAM cell array.

2. The CAM of claim 1, wherein:
each CAM cell array includes a plurality CAM cells arranged into a number of rows and provides a match indication between a comparand value and one row in one mode, and a portion of a comparand value and one row in another mode.

3. The CAM of claim 2, wherein:
each CAM cell array is configurable between three modes of operation including
a first mode that compares a comparand to a number of rows, a second mode that compares a one portion of comparand to a subset of rows and another portion of a comparand to another subset of rows, and
a third mode that compares a first portion of a comparand value to a first subset of rows, a second portion of a comparand value to a second subset of rows, a third portion of a comparand value to a third subset of rows, and a fourth portion of a comparand value to a fourth subset of rows.

4. The CAM of claim 1, further including:
each CAM cell array includes a plurality CAM cells arranged into rows that provide match indications; and
a plurality of logic circuits that combine a predetermined number of match indications and generate a combined comparand match indications.

5. The CAM of claim 4, wherein:
the plurality of logic circuits combine two match indications in one mode and four match indications in another mode.

6. The CAM of claim 1, wherein:
each CAM cell array is configurable between one mode that compares a comparand value of size N to the data values of the CAM cell array, and at least one other mode that compares a comparand value of size $N*2^m$ to the data values of the CAM cell array, where m is an integer that can include zero.

7. The CAM of claim 1, further including:
a register that stores mode information for each CAM cell array; and
each CAM cell array mode is configured according to the mode information.

8. A content addressable memory (CAM), comprising:
a plurality of CAM cells each coupled to at least one match line and arranged into a plurality of sections having separately configurable section widths.

9. The CAM of claim 8, wherein:
each section includes a first configuration having a first section width and at least one other configuration having larger section width than the first section width.

10. The CAM of claim 9, wherein:
each section includes a first section depth in the first configuration and the at least one other configuration includes a section depth smaller than the first section depth.

11. The CAM of claim 8, wherein:
each section includes a first configuration having a first section width and a second configuration having a second section width that is twice the first section width.

12. The CAM of claim 11, wherein:
the first configuration includes a first section depth and the second configuration includes a second depth that is one half the first section depth.

13. The CAM of claim 8, wherein:
at least one section includes a plurality of entries, the entries storing data values that are compared to a comparand in a first configuration, and data value portions that are compared to comparand portions in a second configuration.

14. The CAM of claim 13, wherein:
each section includes at least two sub-sections, one sub-section including alternating first and third data entries that can be compared to first and third comparand portions, and another sub-section including alternating second and fourth data entries that can be compared to second and fourth comparand portions.

15. The CAM of claim 8, wherein:
each section includes a plurality of entries, each entry including at least one bit location having a value stored therein that is dependent upon the configuration of the section.

16. A content addressable memory (CAM), comprising:
a plurality of sections that include CAM cells coupled to at least one match line and have separately configurable modes of operation including a first mode that compares a comparand value to data values with a single compare operation and at least a second mode that compares a comparand value to data values with multiple compare operations that are logically combined.

17. The CAM of claim 16, wherein:
the CAM receives a timing signal; and
compare operations are synchronous with the timing signal.

18. The CAM of claim 16, further including:
each compare operation generating a compare result; and
a plurality of compare result registers that store compare operation results in the second mode of operation for combination with subsequent compare results.

19. The CAM of claim 16, further including:
each section includes a plurality of first entries and a plurality of second entries, each entry including a predetermined number of CAM cells; and
a comparand bus having a first portion coupled to the first entries of each section and a second portion coupled to the second entries of each section.

20. The CAM of claim 16, wherein:
each section includes a plurality of ternary CAM cells.

* * * * *